United States Patent
Zhang et al.

(10) Patent No.: US 11,245,337 B2
(45) Date of Patent: Feb. 8, 2022

(54) POWER SUPPLY DEVICE

(71) Applicant: TOSHIBA MITSUBISHI-ELECTRIC INDUSTRIAL SYSTEMS CORPORATION, Chuo-ku (JP)

(72) Inventors: Xiaochen Zhang, Chuo-ku (JP); Toshihide Nakano, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/959,520

(22) PCT Filed: Nov. 21, 2018

(86) PCT No.: PCT/JP2018/042963
§ 371 (c)(1),
(2) Date: Jul. 1, 2020

(87) PCT Pub. No.: WO2020/105135
PCT Pub. Date: May 28, 2020

(65) Prior Publication Data
US 2021/0057997 A1    Feb. 25, 2021

(51) Int. Cl.
*H02M 3/325* (2006.01)
*H02M 3/335* (2006.01)
(Continued)

(52) U.S. Cl.
CPC ........... *H02M 3/33507* (2013.01); *H02J 9/06* (2013.01); *H02M 1/08* (2013.01);
(Continued)

(58) Field of Classification Search
CPC .... H02J 9/061; H02J 9/062; H02J 9/06; H02J 7/0029; H02J 7/0021; H02J 7/0031;
(Continued)

(56) References Cited

U.S. PATENT DOCUMENTS 5,467,049 A     11/1995  Kida et al.
10,855,100 B2 * 12/2020  Takita .................... B60R 16/02
(Continued)

FOREIGN PATENT DOCUMENTS

JP      62-19047 U     2/1987
JP      2-106158 A     4/1990
(Continued)

OTHER PUBLICATIONS

International Search Report dated Dec. 18, 2018 in PCT/JP2018/042963 filed on Nov. 21, 2018, 1 page.
(Continued)

*Primary Examiner* — Adolf D Berhane
(74) *Attorney, Agent, or Firm* — Oblon, McClelland, Maier & Neustadt, L.L.P.

(57) ABSTRACT

A switch circuit includes n switching elements (n≥2) connected in series between an input node and an output node. A control device is configured to convert DC power in a power storage device into AC power synchronized with AC power supplied from an AC power supply during a normal state and supply the AC power to the output node, by controlling a power converter, when an abnormality of at least one of the AC power supply and the switch circuit is sensed in a state where the control device outputs conduction commands for the n switching elements. The control device is further configured to produce cutoff commands for cutting off the n switching elements during execution of power conversion in the power converter, and sense a cutoff abnormality of the switch circuit based on terminal-to-terminal voltages of the n switching elements during production of the cutoff commands.

4 Claims, 7 Drawing Sheets

(51) Int. Cl.
    *H02J 9/06*        (2006.01)
    *H02M 1/08*       (2006.01)
    *H03K 17/687*    (2006.01)
    *H02M 1/00*       (2006.01)

(52) U.S. Cl.
    CPC ...... *H02M 3/33584* (2013.01); *H03K 17/687* (2013.01); *H02M 1/0003* (2021.05)

(58) Field of Classification Search
    CPC .......... H02J 9/068; H02M 1/006; H02M 1/08; H02M 1/32; H02M 1/623; H02M 3/33584; H02M 3/33507; H02M 1/0003; H03K 17/107; H03K 17/687
    See application file for complete search history.

(56) References Cited

U.S. PATENT DOCUMENTS

2021/0242770 A1*   8/2021   Zhang .................. H03K 17/567
2021/0273549 A1*   9/2021   Nakano ................ H02M 7/217

FOREIGN PATENT DOCUMENTS

| JP | 5-36332 A | 2/1993 |
| JP | 6-104712 A | 4/1994 |
| WO | WO 2013/132833 A1 | 9/2013 |

OTHER PUBLICATIONS

Written Opinion of the International Searching Authority dated Dec. 18, 2018 in PCT/JP2018/042963 with English translation, 8 pages.
Indian Office Action dated Jun. 29, 2021 in Indian Patent Application No. 202017028282, 6 pages.

* cited by examiner

FIG.8

|  | V1 | V2 | V3 | V4 | DETERMINATION UNIT 22A | DETERMINATION UNIT 22B | DETERMINATION UNIT 22C |
|---|---|---|---|---|---|---|---|
| NUMBER OF ABNORMAL ELEMENTS = 1 | H | H | H | L | OK | OK | OK |
|  | H | H | L | H | OK | OK | OK |
|  | H | L | H | L | OK | OK | OK |
|  | L | H | H | L | OK | OK | OK |
| NUMBER OF ABNORMAL ELEMENTS ≥ 2 AND NUMBER OF NORMAL ELEMENTS ≥ 1 | H | H | L | L | OK | OK | NG |
|  | H | L | H | L | OK | OK | NG |
|  | H | L | L | H | OK | OK | NG |
|  | L | H | H | L | OK | OK | NG |
|  | L | H | L | H | OK | OK | NG |
|  | L | L | H | H | OK | OK | NG |
|  | L | L | L | H | OK | OK | NG |
|  | L | L | H | L | OK | OK | NG |
|  | L | H | L | L | OK | OK | NG |
|  | H | L | L | L | OK | OK | NG |
| ALL ELEMENTS ARE ABNORMAL | L | L | L | L | OK | NG | NG |

FIG.9

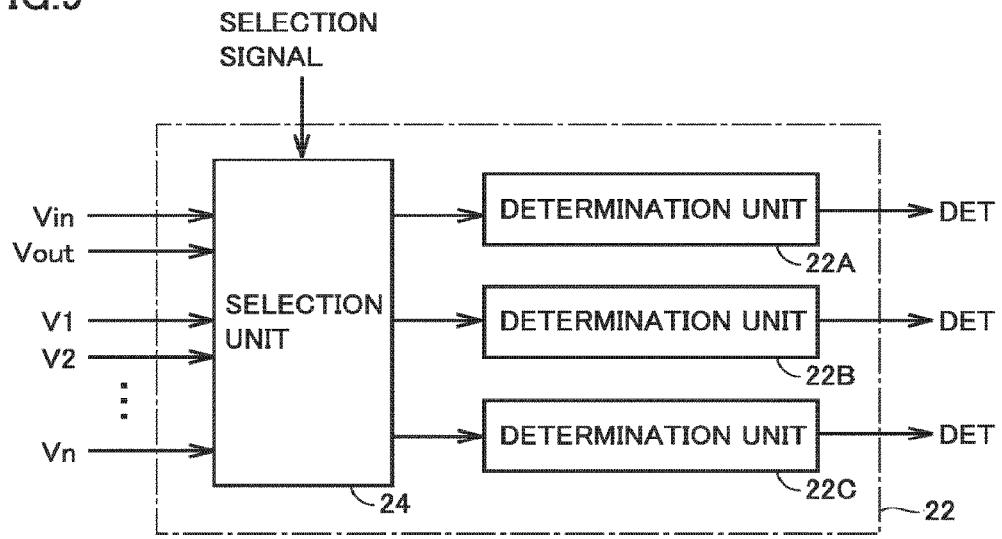

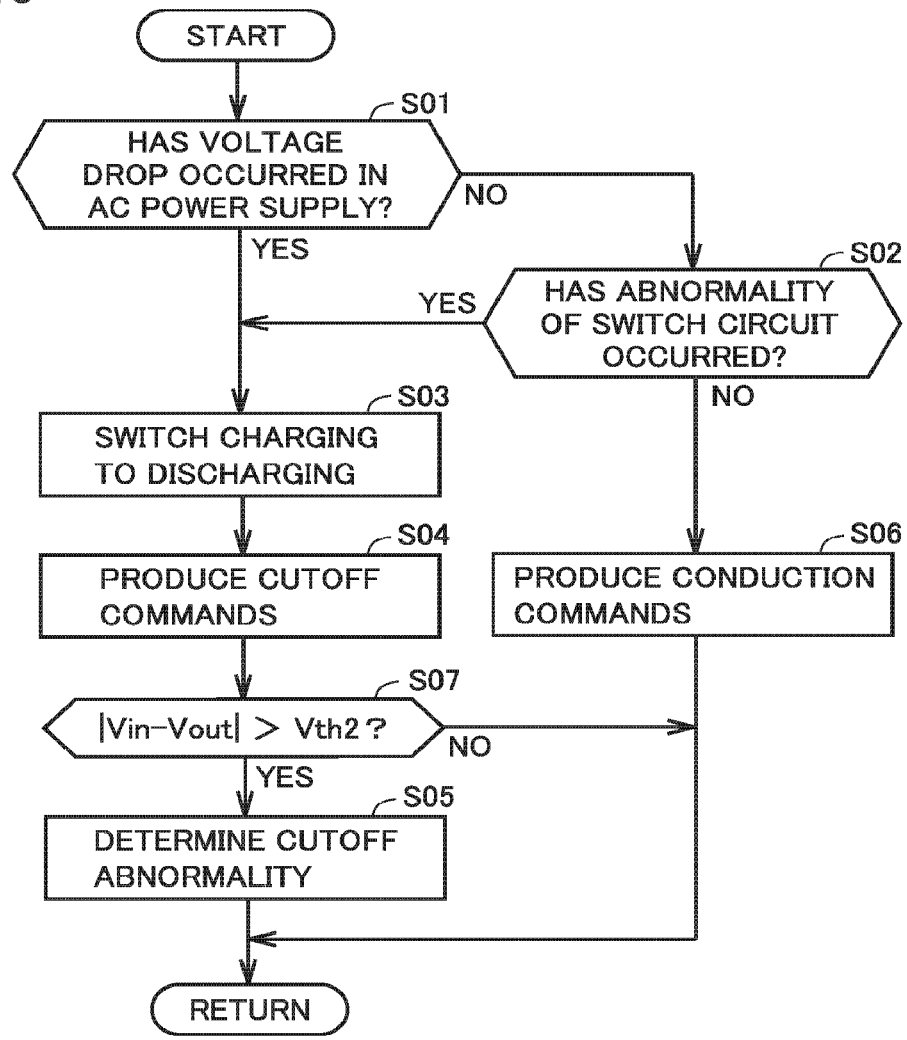

POWER SUPPLY DEVICE

TECHNICAL FIELD

The present invention relates to a power supply device.

BACKGROUND ART

Japanese Patent Laying-Open No. H02-106158 (PTL 1) discloses a power conversion device having a circuit configured by connecting a plurality of self-arc-extinguishing semiconductor switching elements in series. In PTL 1, each semiconductor switching element is provided with detection means for detecting that the semiconductor switching element cannot be cut off. The detection means is configured to detect that the semiconductor switching element cannot be cut off, using a terminal-to-terminal voltage of a GTO (Gate Turn-Off thyristor) serving as the semiconductor switching element.

CITATION LIST

Patent Literature

PTL 1: Japanese Patent Laying-Open No. H02-106158

SUMMARY OF INVENTION

Technical Problem

A multiple power compensator is an exemplary power supply device for supplying alternating current (AC) power to a load. Generally, the multiple power compensator is connected between an AC power supply and the load, and is configured to uninterruptedly supply stable AC power to the load even when a power failure or an instantaneous voltage drop occurs in the AC power supply.

In the multiple power compensator, a switch circuit configured by connecting a plurality of semiconductor switching elements in series is provided between the AC power supply and the load. In a normal state, AC power of the AC power supply is supplied to the load by conducting (turning on) the plurality of semiconductor switching elements. On the other hand, when a power failure or an instantaneous voltage drop occurs, or when a control abnormality occurs, the AC power supply is cut off by cutting off (turning off) the plurality of semiconductor switching elements, and a bidirectional converter starts supplying power from a power storage device to the load.

When any of the plurality of semiconductor switching elements cannot be cut off in such a power supply device, within the switch circuit, a voltage difference between an input terminal and an output terminal of the switch circuit may be intensively applied to some semiconductor switching elements which are normally turned off. Therefore, means for sensing that a semiconductor switching element cannot be cut off is required.

However, in a situation where the switch circuit is cut off in the power supply device, an AC voltage synchronized with an AC voltage supplied to an input side of the switch circuit is supplied to an output side of the switch circuit, by controlling the bidirectional converter. Thus, the input voltage and the output voltage of the switch circuit may have an equal voltage level. In such a case, within the switch circuit, a significant voltage difference is not produced between terminals of a semiconductor switching element which is normally turned off. Thus, using a terminal-to-terminal voltage of the semiconductor switching element as described in PTL 1 may lead to erroneous sensing that the semiconductor switching element cannot be cut off.

The present invention has been made to solve the aforementioned problem, and an object of the present invention is to accurately sense a cutoff abnormality of a switch circuit having a plurality of semiconductor switching elements connected in series in a power supply device.

Solution to Problem

According to the present invention, a power supply device for supplying power to a load includes a switch circuit, a power converter, and a control device configured to control the switch circuit and the power converter. The switch circuit has an input node connected to an AC power supply and an output node connected to the load. The power converter is configured to execute bidirectional power conversion between AC power output to the output node and direct current (DC) power input/output to a power storage device. The switch circuit includes n switching elements (n being an integer more than or equal to 2) connected in series between the input node and the output node. The control device is configured to convert the DC power in the power storage device into AC power synchronized with AC power supplied from the AC power supply during a normal state and supply the AC power to the output node, by controlling the power converter, when an abnormality of at least one of the AC power supply and the switch circuit is sensed in a state where the control device outputs conduction commands for conducting the n switching elements. The control device is further configured to produce cutoff commands for cutting off the n switching elements during execution of the power conversion in the power converter, and sense a cutoff abnormality of the switch circuit based on terminal-to-terminal voltages of the n switching elements during production of the cutoff commands.

Advantageous Effects of Invention

According to the present invention, in a power supply device, a cutoff abnormality of a switch circuit having a plurality of semiconductor switching elements connected in series can be accurately sensed.

BRIEF DESCRIPTION OF DRAWINGS

FIG. 8 is a view showing a result of comparison among manners of cutoff abnormalities which can sensed by the determination units in the first to third control configuration examples.

FIG. 9 is a block diagram for illustrating a fourth configuration example of the determination unit configured to execute the cutoff abnormality determination processing shown in step S05 of FIG. 4.

FIG. 10 is a flowchart illustrating control processing for a power supply device in accordance with a fourth embodiment.

DESCRIPTION OF EMBODIMENTS

Figure 1:
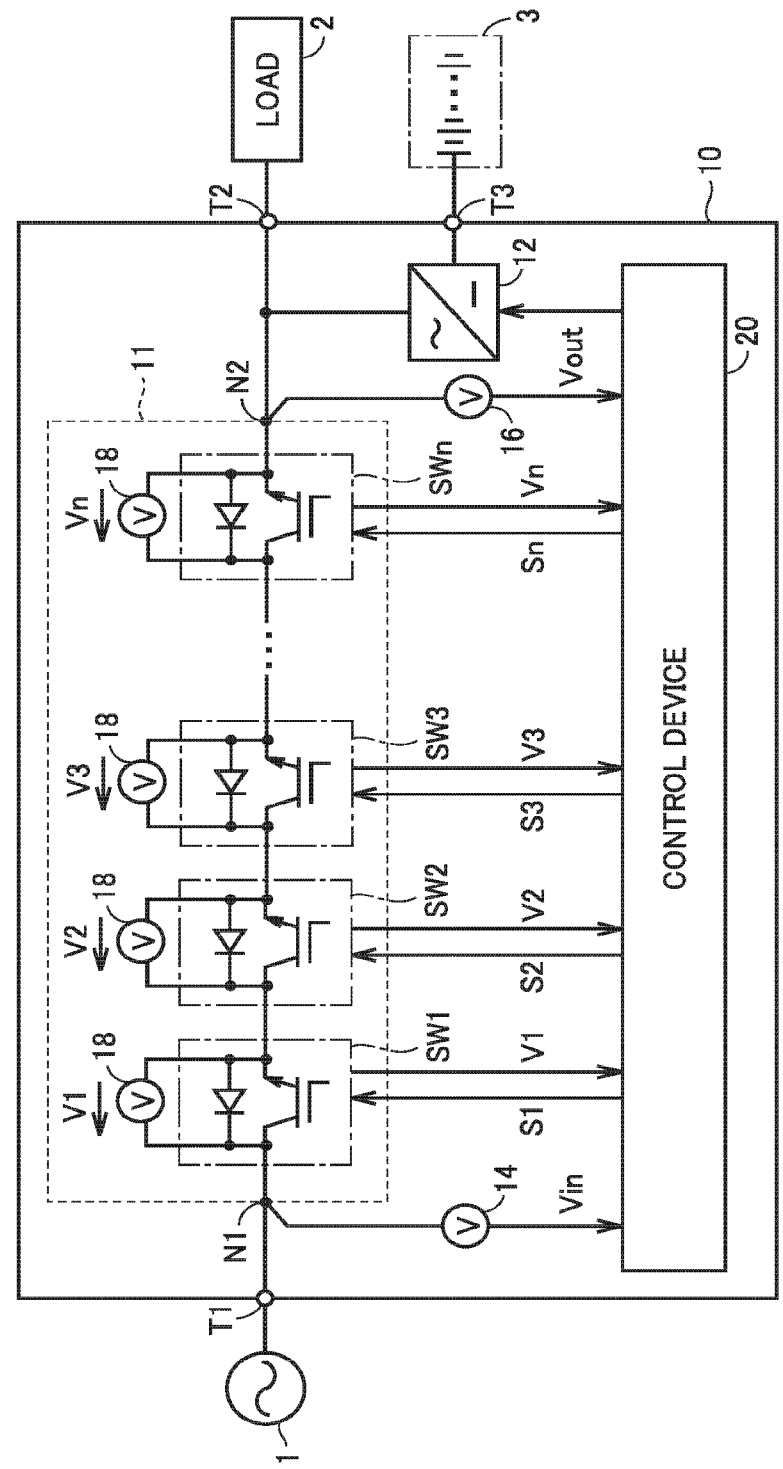
FIG. 1 is a view showing a schematic configuration of a power supply device in accordance with a first embodiment of the present invention.

Hereinafter, embodiments of the present invention will be described in detail with reference to the drawings. It should be noted that, in the following, identical or corresponding parts in the drawings will be designated by the same reference numerals, and the description thereof will not be repeated in principle.

First Embodiment

FIG. 1 is a view showing a schematic configuration of a power supply device in accordance with a first embodiment of the present invention.

Referring to FIG. 1, a power supply device 10 is connected between an AC power supply 1 and a load 2, and is configured to receive AC power from AC power supply 1 and supply the AC power to load 2. Power supply device 10 is applicable, for example, to a device for uninterruptedly supplying stable AC power to load 2 when a power failure or an instantaneous voltage drop occurs in AC power supply 1 (for example, a multiple power compensator). It should be noted that, although FIG. 1 shows only a portion related to one-phase AC power, power supply device 10 may receive three-phase AC power and output the three-phase AC power.

AC power supply 1 is typically a commercial AC power supply, and supplies AC power having a commercial frequency to power supply device 10. Load 2 is driven by the AC power having the commercial frequency supplied from power supply device 10.

As shown in FIG. 1, power supply device 10 includes an input terminal T1, an output terminal T2, a DC terminal T3, a switch circuit 11, a bidirectional converter 12, voltage detectors 14, 16, and 18, and a control device 20.

Input terminal T1 is electrically connected to AC power supply 1, and receives the AC power having the commercial frequency supplied from AC power supply 1. Output terminal T2 is connected to load 2. DC terminal T3 is connected to a battery 3. Battery 3 corresponds to one embodiment of a "power storage device" for storing DC power. Instead of battery 3, an electric double layer capacitor may be connected to DC terminal T3, as a power storage device.

Switch circuit 11 is connected between input terminal T1 and output terminal T2, and is configured to switch between electrical connection and cutoff between AC power supply 1 and load 2. Specifically, switch circuit 11 has an input node N1, an output node N2, and n semiconductor switching elements SW1 to SWn (n is an integer more than or equal to 2). Input node N1 is connected to input terminal T1, and output node N2 is connected to output terminal T2.

n semiconductor switching elements SW1 to SWn are connected in series between input node N1 and output node N2. Conduction (turning on) and cutoff (turning off) of semiconductor switching elements SW1 to SWn are controlled by control signals S1 to Sn, respectively, input from control device 20. In the following, when semiconductor switching elements SW1 to SWn are collectively described, they will also be simply referred to as "semiconductor switching elements SW", and when control signals S1 to Sn are collectively described, they will also be simply referred to as "control signals S".

Each semiconductor switching element SW is turned on by control signal S at an H (logic high) level, and is turned off by control signal S at an L (logic low) level. That is, control signal S at the H level corresponds to an ON command for turning on semiconductor switching element SW (conduction command), and control signal S at the L level corresponds to an OFF command for turning off semiconductor switching element SW (cutoff command).

Each semiconductor switching element SW can be configured by connecting an FWD (Freewheeling Diode) in anti-parallel with any self-arc-extinguishing switching element such as an IGBT (Insulated Gate Bipolar Transistor) or a GCT (Gate Commutated Turn-off) thyristor. Although a semiconductor switching element is used as a "switching element" within switch circuit 11 in the present embodiment, another switching element can be used instead of semiconductor switching element SW, as long as turning on/off of the other switching element is controlled by control device 20 and current passage and cutoff can be controlled by control device 20.

Bidirectional converter 12 is connected between output node N2 of switch circuit 11 and DC terminal T3. Bidirectional converter 12 is configured to execute bidirectional power conversion between AC power output to output node N2 and DC power input/output to battery 3. Bidirectional converter 12 corresponds to one embodiment of a "power converter".

During a normal state in which the AC power is supplied from AC power supply 1, bidirectional converter 12 converts the AC power from AC power supply 1 into DC power and stores the DC power in battery 3. On the other hand, when there occurs a power failure in which the supply of the AC power from AC power supply 1 is stopped, or when there occurs an instantaneous voltage drop in AC power supply 1, bidirectional converter 12 converts the DC power in battery 3 into AC power having the commercial frequency, and provides the AC power to load 2.

Bidirectional converter 12 has a plurality of semiconductor switching elements, although not shown. Turning on/off of the plurality of semiconductor switching elements is controlled by a control signal generated by control device 20. The control signal is a pulse signal sequence, and is a PWM (Pulse Width Modulation) signal. Bidirectional converter 12 can execute bidirectional power conversion between the AC power output to output node N2 and the DC power input/output to DC terminal T3, by turning on or off the plurality of semiconductor switching elements at predetermined timing in response to the control signal.

Voltage detector 14 detects an AC voltage input to input node N1 of switch circuit 11 (hereinafter also referred to as an "input voltage Vin"). Voltage detector 16 detects an AC voltage output to output node N2 of switch circuit 11 (hereinafter also referred to as an "output voltage Vout").

Each voltage detector 18 detects a terminal-to-terminal voltage of semiconductor switching element SW. In the example of FIG. 1, each voltage detector 18 is configured to detect a voltage between a collector terminal and an emitter terminal of an IGBT. Detection values V1 to Vn detected by voltage detectors 18 correspond to terminal-to-terminal voltages of semiconductor switching elements SW1 to SWn, respectively. In the following, when terminal-to-terminal voltages V1 to Vn are collectively described, they will also be simply referred to as "terminal-to-terminal voltages V".

Control device 20 controls turning on/off of switch circuit 11 (semiconductor switching elements SW) and operation of bidirectional converter 12, using a command from a higher-order controller not shown, detection signals input from voltage detectors 14, 16, and 18, and the like. Control device 20 can be configured, for example, by a microcomputer or the like. As an example, control device 20 includes a CPU (Central Processing Unit) and a memory not shown, and can execute control operation described below by software processing performed by the CPU executing a program stored beforehand in the memory. Alternatively, the control operation can be partly or entirely implemented by hardware processing using a dedicated embedded electronic circuit and the like, instead of software processing.

Next, operation of power supply device 10 in accordance with the present embodiment will be described with reference to FIGS. 2 and 3.

Figure 2:
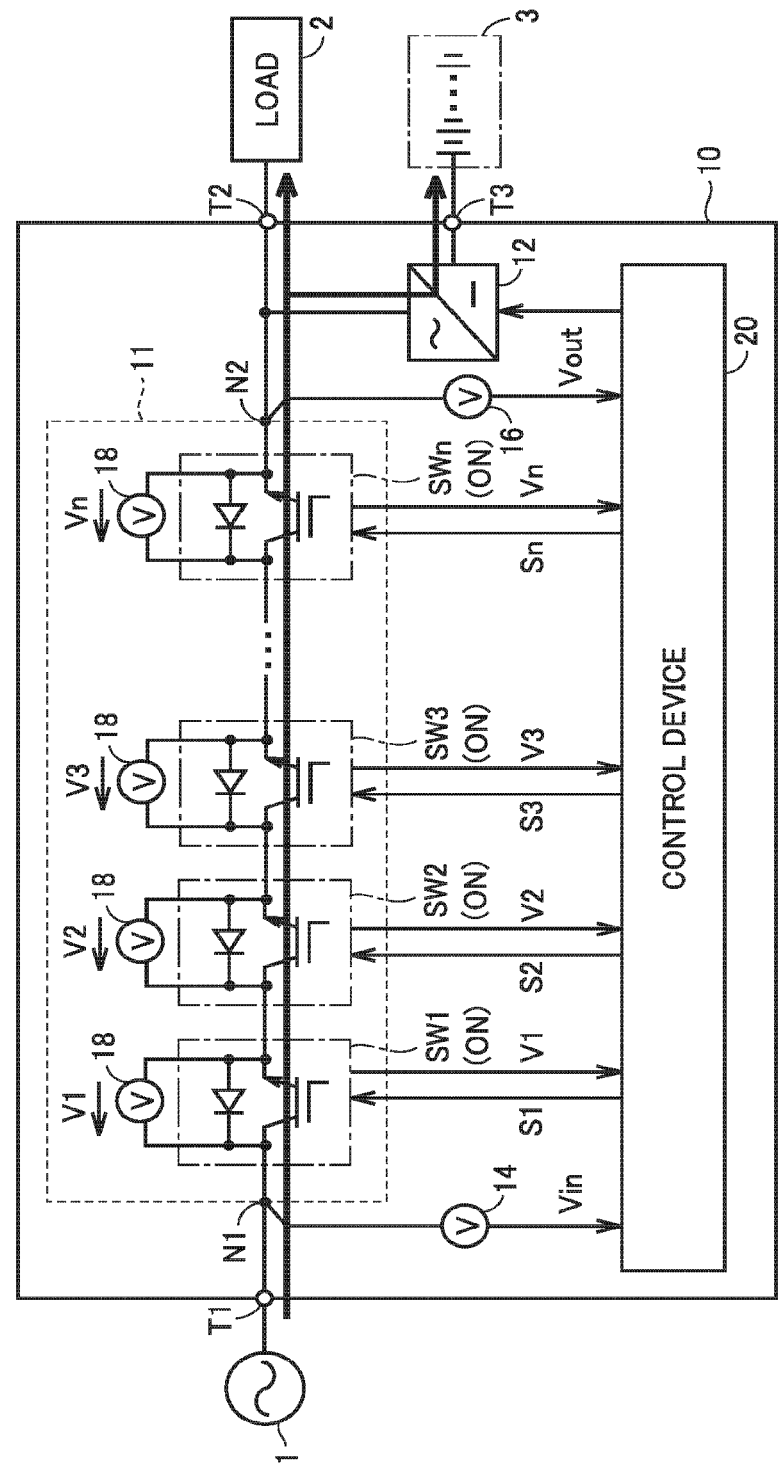
FIG. 2 is a view for illustrating a power supply path during a normal state.

FIG. 2 is a view for illustrating a power supply path during a normal state.

Referring to FIG. 2, during a normal state in which the power is normally supplied from AC power supply 1, control device 20 provides control signals S1 to Sn at the H level (conduction commands) to respective semiconductor switching elements SW1 to SWn constituting switch circuit 11. By turning on semiconductor switching elements SW1 to SWn, switch circuit 11 enters an ON state, and load 2 is electrically connected with AC power supply 1. As a result, the AC power from AC power supply 1 is supplied to load 2 via switch circuit 11, as indicated by an arrow in the drawing.

The AC power from AC power supply 1 is also converted into DC power by bidirectional converter 12 and is stored in battery 3. When a terminal-to-terminal voltage of battery 3 reaches a predetermined charging stop voltage, control device 20 stops operation of bidirectional converter 12.

Figure 3:
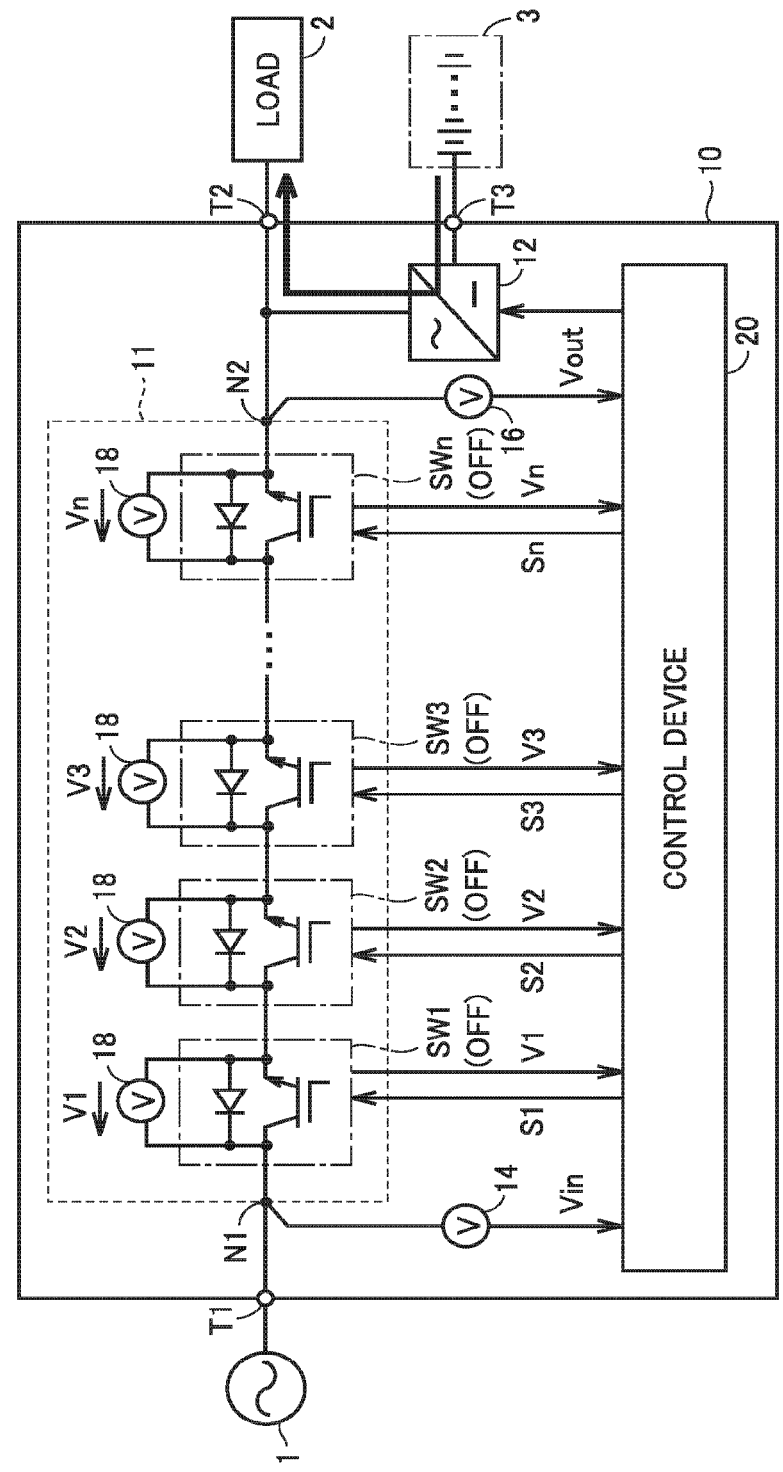
FIG. 3 is a view for illustrating a power supply path during an abnormal state.

FIG. 3 is a view for illustrating a power supply path during an abnormal state.

Referring to FIG. 3, when there occurs a power failure in which the supply of the AC power from AC power supply 1 is stopped, or when there occurs an instantaneous voltage drop in which a supply voltage of AC power supply 1 drops instantaneously, the DC power in battery 3 is converted into AC power by bidirectional converter 12, and the AC power is supplied to load 2 via output terminal T2.

On this occasion, control device 20 controls power conversion in bidirectional converter 12 such that the AC voltage output from bidirectional converter 12 to output node N2 (output voltage Vout) is synchronized with the AC voltage input from AC power supply 1 before an abnormality occurs to input node N1 (input voltage Vin). This can suppress voltage fluctuation or instantaneous interruption when the power supply paths are switched therebetween.

During operation of bidirectional converter 12, control device 20 provides control signals S1 to Sn at the L level (cutoff commands) to respective semiconductor switching elements SW1 to SWn of switch circuit 11. By turning off semiconductor switching elements SW1 to SWn, switch circuit 11 enters an OFF state, and load 2 is electrically cut off from AC power supply 1.

As a result, during an abnormal state, the DC power in battery 3 is supplied to load 2 via bidirectional converter 12, as indicated by an arrow in the drawing. When the terminal-to-terminal voltage of battery 3 decreases to a predetermined discharging stop voltage, control device 20 stops operation of bidirectional converter 12.

It should be noted that, also when an element failure or a control abnormality occurs in switch circuit 11, it is possible to continue supplying stable power to load 2 using the power supply path shown in FIG. 3, by operating bidirectional converter 12 and turning off switch circuit 11. As a result, even when an abnormality occurs in AC power supply 1 or switch circuit 11, it is possible to continue supplying stable power to load 2 uninterruptedly.

However, when there occurs an abnormality in which some of semiconductor switching elements SW1 to SWn cannot be cut off, an irregular state may occur during production of the cutoff commands. In the irregular state, some semiconductor switching elements SW are not turned off and maintains an ON state, whereas remaining semiconductor switching elements SW are turned off. When such a irregular state occurs in semiconductor switching elements SW1 to SWn connected in series, a voltage difference between input node N1 and output node N2 is intensively applied to remaining semiconductor switching elements SW in an OFF state. Therefore, there is a concern that an overvoltage may be applied to remaining semiconductor switching elements SW.

Figure 4:
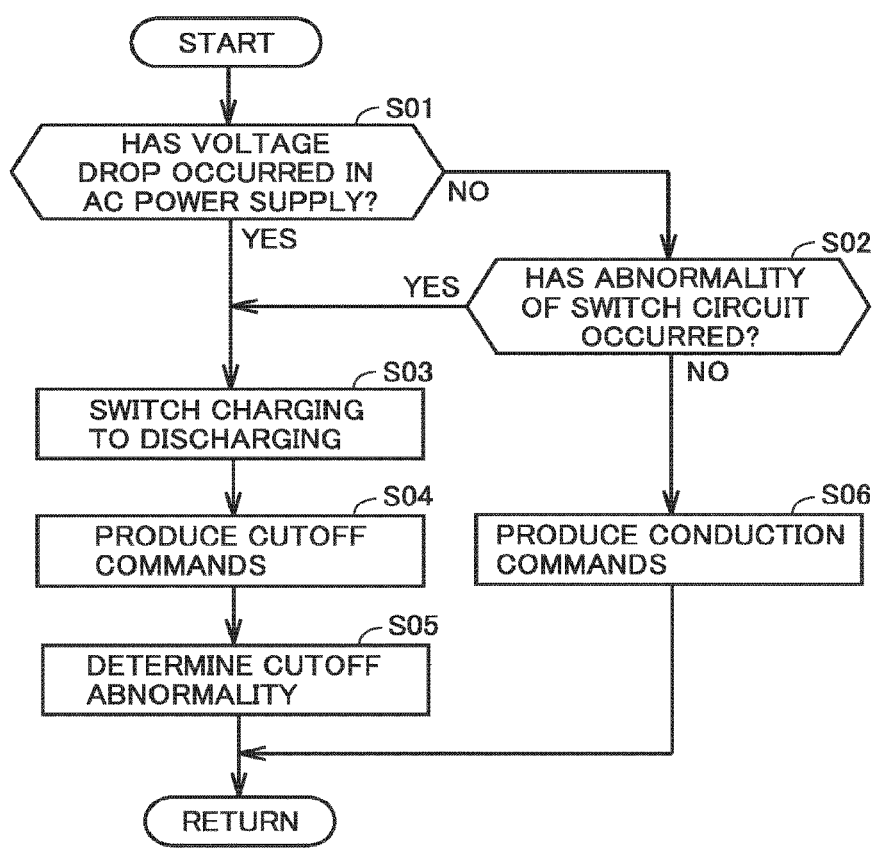
FIG. 4 is a flowchart illustrating control processing for the power supply device in accordance with the first embodiment.

Accordingly, in the present embodiment, control device 20 is configured to sense a cutoff abnormality of switch circuit 11 during production of the cutoff commands. FIG. 4 is a flowchart illustrating control processing for power supply device 10 in accordance with the first embodiment. Control device 20 periodically executes the control processing shown in FIG. 4.

Referring to FIG. 4, in step S01, control device 20 determines whether or not a voltage drop has occurred in AC power supply 1. Specifically, control device 20 determines whether or not a power failure or an instantaneous voltage drop has occurred in AC power supply 1, based on a detection value of input voltage Vin detected by voltage detector 14. For example, control device 20 determines whether or not a power failure or an instantaneous voltage drop has occurred, by comparing a maximum value (or an effective value) of the detection value of voltage detector 14 with a predetermined reference value.

When a voltage drop has not occurred in AC power supply 1 (when it is determined NO in S01), in step S02, control device 20 determines whether or not an abnormality of switch circuit 11 has occurred. For example, when there occurs a control abnormality due to a failure of at least one semiconductor switching element SW, a failure of a gate drive circuit of an IGBT included in semiconductor switching element SW, or the like, control device 20 determines that switch circuit 11 is abnormal.

When switch circuit 11 is normal (when it is determined NO in S02), in step S06, control device 20 provides conduction commands to semiconductor switching elements SW of switch circuit 11.

On the other hand, when a voltage drop has occurred in AC power supply 1 (when it is determined YES in S01), or when an abnormality of switch circuit 11 has occurred (when it is determined YES in S02), control device 20 proceeds to step S03 to convert the DC power in battery 3 into AC power having the commercial frequency and provide the AC power to load 2, by controlling bidirectional converter 12. Control device 20 controls power conversion in bidirectional converter 12 such that the AC voltage output from bidirectional converter 12 to output node N2 (output voltage Vout) is synchronized with the AC voltage provided from AC power supply 1 before a voltage drop occurs to input node N1 (input voltage Vin). Battery 3 is switched from charging by the AC power from AC power supply 1 to discharging for supplying power to load 2.

During operation of bidirectional converter 12, in step S04, control device 20 produces cutoff commands for semiconductor switching elements SW1 to SWn of switch circuit 11. During production of the cutoff commands, in step S05, control device 20 executes cutoff abnormality determination processing for determining whether or not a cutoff abnormality of switch circuit 11 has occurred.

Figure 5:
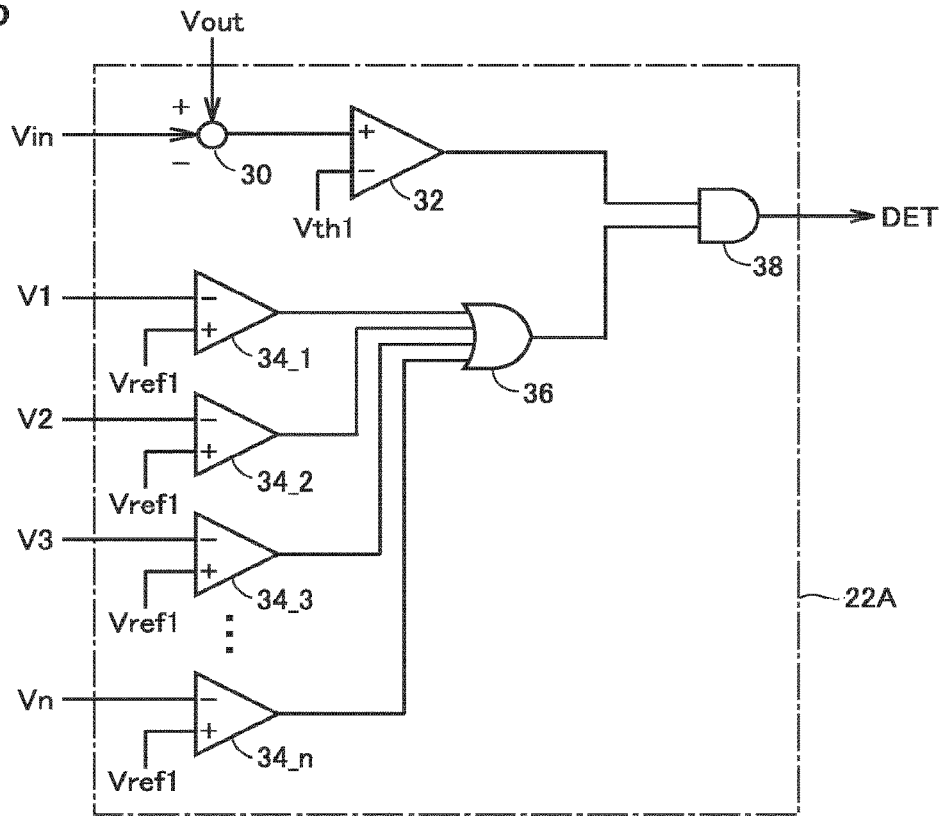
FIG. 5 is a block diagram for illustrating a first configuration example of a determination unit configured to execute cutoff abnormality determination processing shown in step S05 of FIG. 4.

FIG. 5 is a block diagram for illustrating a first configuration example of a determination unit configured to execute the cutoff abnormality determination processing shown in step S05 of FIG. 4. The function of each block shown in FIG. 5 can be implemented by software processing and/or hardware processing executed by control device 20.

Referring to FIG. 5, a determination unit 22A has a subtractor 30, a comparator 32, n comparators 34_1 to 34_n, an OR circuit 36, and an AND circuit 38.

Subtractor 30 calculates a voltage difference between the detection value of input voltage Vin detected by voltage detector 14 and a detection value of output voltage Vout detected by voltage detector 16. Comparator 32 compares the voltage difference between input voltage Vin and output voltage Vout with a threshold value Vth1, and outputs a signal indicating the result of comparison. When the voltage difference is larger than threshold value Vth1, the output signal of comparator 32 is set to an H level, and when the voltage difference is smaller than threshold value Vth1, the output signal of comparator 32 is set to an L level. Threshold value Vth1 corresponds to one embodiment of a "first threshold value".

n comparators 34_1 to 34_n respectively receive terminal-to-terminal voltages V1 to Vn of the semiconductor switching elements detected by n voltage detectors 18. When comparators 34_1 to 34_n are collectively described, they will also be simply referred to as "comparators 34". Each comparator 34 compares terminal-to-terminal voltage V of corresponding semiconductor switching element SW with a reference value Vref1, and outputs a signal indicating the result of comparison. When terminal-to-terminal voltage V is smaller than reference value Vref1, the output signal of comparator 34 is set to an H level, and when terminal-to-terminal voltage V is larger than reference value Vref1, the output signal of comparator 34 is set to an L level. Reference value Vref1 corresponds to one embodiment of a "reference value".

OR circuit 36 calculates a logical sum (OR) of the output signals of comparators 34_1 to 34_n, and outputs a signal indicating the result of calculation.

AND circuit 38 calculates a logical multiplication (AND) of the output signal of comparator 32 and the output signal of OR circuit 36, and outputs a signal indicating the result of calculation. The output signal of AND circuit 38 is output to the outside of power supply device 10 (for example, to the higher order controller), as a detection signal DET.

In determination unit 22A, when the voltage difference between input voltage Vin and output voltage Vout is larger than threshold value Vth1, and terminal-to-terminal voltages V of p semiconductor switching elements SW ($1 \leq p \leq n$) of n semiconductor switching elements SW1 to SWn are smaller than reference value Vref1, detection signal DET at an H level is output.

Thus, when input voltage Vin decreases due to an abnormality of AC power supply 1 and bidirectional converter 12 generates output voltage Vout, the voltage difference between input voltage Vin and output voltage Vout becomes larger than threshold value Vth1. In this state, cutoff commands are provided to n semiconductor switching elements SW1 to SWn. When semiconductor switching element SW is normally turned off according to a cutoff command, terminal-to-terminal voltage V of semiconductor switching element SW becomes larger than reference value Vref1. On the other hand, when there occurs an abnormality in which semiconductor switching element SW cannot be cut off, semiconductor switching element SW maintains the ON state, and thus terminal-to-terminal voltage V becomes smaller than reference value Vref1.

When n semiconductor switching elements SW1 to SWn include p semiconductor switching elements SW ($1 \leq p \leq n$) which cannot be cut off, detection signal DET at the H level is output from determination unit 22A.

It should be noted that, according to the cutoff abnormality determination processing executed by determination unit 22A, when the voltage difference between input voltage Vin and output voltage Vout is smaller than threshold value Vth1, a significant voltage difference is not produced in the terminal-to-terminal voltage of semiconductor switching element SW which is normally turned off, and thus it is not possible to sense a cutoff abnormality.

More specifically, when output voltage Vout is generated by bidirectional converter 12 (S03 in FIG. 4) due to occurrence of an abnormality of switch circuit 11 (however, AC power supply 1 is normal) and cutoff commands are output to switch circuit 11 (S04 in FIG. 4), input voltage Vin and output voltage Vout are at an equal level, and thus terminal-to-terminal voltage V of semiconductor switching element SW which is normally turned off has a value close to a zero voltage. Accordingly, there is no significant difference between terminal-to-terminal voltage V of semiconductor switching element SW which cannot be cut off and terminal-to-terminal voltage V of semiconductor switching element SW in the OFF state, and as a result, it is difficult to sense a cutoff abnormality.

However, under such circumstances, there occurs no situation where an overvoltage is applied to semiconductor switching element SW in the OFF state. Thus, it is considered that no defect would be caused by not being able to sense a cutoff abnormality.

It should be noted that, according to a conventional technique of sensing a cutoff abnormality for each semiconductor switching element based on a terminal-to-terminal voltage thereof, when semiconductor switching element SW which is normally turned off has a small terminal-to-terminal voltage, semiconductor switching element SW may be erroneously sensed as not being able to be cut off. In contrast, determination unit 22A is configured to sense a cutoff abnormality based on terminal-to-terminal voltages V1 to Vn of n semiconductor switching elements SW1 to SWn, and thus can avoid such erroneous sensing.

As described above, according to power supply device 10 in accordance with the first embodiment, a cutoff abnormality of a semiconductor switching element constituting the switch circuit can be accurately sensed.

Second Embodiment

A second embodiment will describe a second configuration example of the determination unit configured to execute the cutoff abnormality determination processing.

Figure 6:
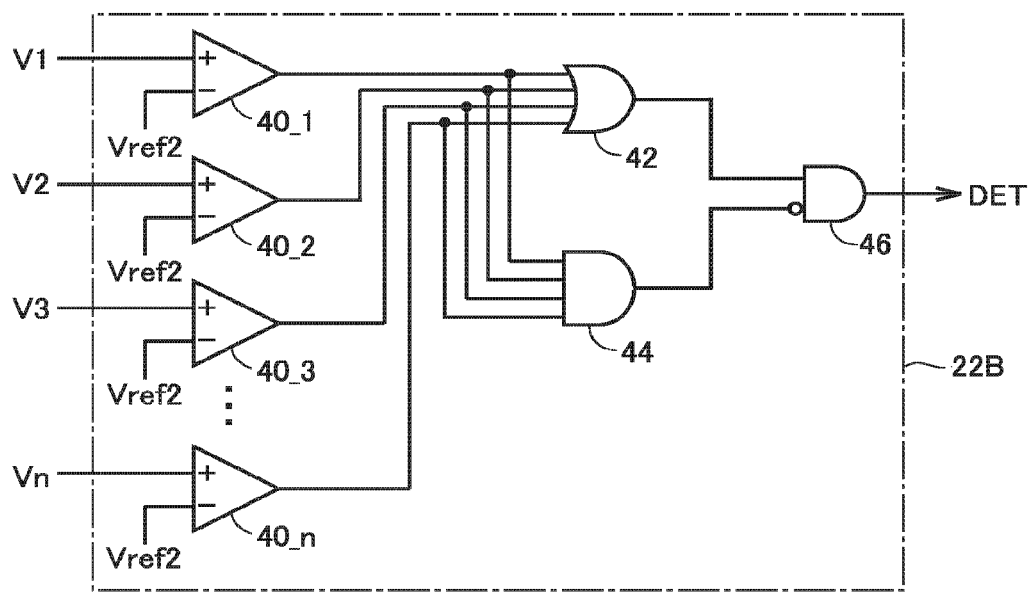
FIG. 6 is a block diagram for illustrating a second configuration example of the determination unit configured to execute the cutoff abnormality determination processing shown in step S05 of FIG. 4.

FIG. 6 is a block diagram for illustrating the second configuration example of the determination unit configured to execute the cutoff abnormality determination processing shown in step S05 of FIG. 4. The function of each block shown in FIG. 6 can be implemented by software processing and/or hardware processing executed by control device 20.

Referring to FIG. 6, a determination unit 22B has n comparators 40_1 to 40_$n$, an OR circuit 42, and AND circuits 44 and 46.

n comparators 40_1 to 40_$n$ respectively receive terminal-to-terminal voltages V1 to Vn of the semiconductor switching elements detected by n voltage detectors 18. When comparators 40_1 to 40_$n$ are collectively described, they will also be simply referred to as "comparators 40". Each comparator 40 compares terminal-to-terminal voltage V of corresponding semiconductor switching element SW with a reference value Vref2, and outputs a signal indicating the result of comparison. When terminal-to-terminal voltage V is larger than reference value Vref2, the output signal of comparator 40 is set to an H level, and when terminal-to-terminal voltage V is smaller than reference value Vref2, the output signal of comparator 40 is set to an L level. Reference value Vref2 corresponds to one embodiment of a "reference value".

OR circuit 42 calculates a logical sum (OR) of the output signals of comparators 40_1 to 40_$n$, and outputs a signal indicating the result of calculation.

AND circuit 44 calculates a logical multiplication (AND) of the output signals of comparators 40_1 to 40_$n$, and outputs a signal indicating the result of calculation.

AND circuit 46 calculates a logical multiplication of the output signal of OR circuit 42 and an inverted signal of the output signal of AND circuit 44, and outputs a signal indicating the result of calculation. The output signal of AND circuit 46 is output to the outside of power supply device 10 (for example, to the higher order controller), as detection signal DET.

For example, it is assumed that, in a state where cutoff commands are provided to n semiconductor switching elements SW1 to SWn, q semiconductor switching elements SW ($1 \leq q \leq n-1$) cannot be cut off, and remaining (n−q) semiconductor switching elements SW are normally turned off.

In this case, terminal-to-terminal voltages V of q semiconductor switching elements SW become smaller than reference value Vref2, whereas terminal-to-terminal voltages V of (n−q) semiconductor switching elements SW become larger than reference value Vref2. Therefore, a signal at an H level is output from OR circuit 42, and a signal at an L level is output from AND circuit 44, and as a result, detection signal DET at an H level is output from AND circuit 46.

That is, in determination unit 22B, when terminal-to-terminal voltages V of q semiconductor switching elements SW ($1 \leq q \leq n-1$) of n semiconductor switching elements SW1 to SWn are smaller than reference value Vref2, detection signal DET at the H level is output.

It should be noted that, according to the cutoff abnormality determination processing executed by determination unit 22B, when all of n semiconductor switching elements SW1 to SWn cannot be cut off, detection signal DET is set to an L level in response to the output signal at an L level of OR circuit 42, and thus it is not possible to sense a cutoff abnormality. In view of the extremely low probability of occurrence of a defect that all of n semiconductor switching elements SW cannot be cut off at the same time, it is considered that no defect would be caused by not being able to sense a cutoff abnormality.

In addition, as in determination unit 22A, according to the cutoff abnormality determination processing executed by determination unit 22B, when the voltage difference between input voltage Vin and output voltage Vout is small, there is no significant difference between terminal-to-terminal voltage V of semiconductor switching element SW which cannot be cut off and terminal-to-terminal voltage V of semiconductor switching element SW which is normally turned off, and thus it is difficult to sense a cutoff abnormality. However, under such circumstances, there occurs no situation where an overvoltage is applied to semiconductor switching element SW in the OFF state. Thus, it is considered that no defect would be caused by not being able to sense a cutoff abnormality.

According to the conventional technique of sensing a cutoff abnormality for each semiconductor switching element based on a terminal-to-terminal voltage thereof, when semiconductor switching element SW which is normally turned off has small terminal-to-terminal voltage V, semiconductor switching element SW may be erroneously sensed as not being able to be cut off. In contrast, determination unit 22B is configured to sense a cutoff abnormality based on terminal-to-terminal voltages V1 to Vn of n semiconductor switching elements SW1 to SWn, and thus can avoid such erroneous sensing.

As described above, according to power supply device 10 in accordance with the second embodiment, a cutoff abnormality of a semiconductor switching element constituting the switch circuit can be accurately sensed.

Third Embodiment

A third embodiment will describe a third configuration example of the determination unit configured to execute the cutoff abnormality determination processing.

Figure 7:
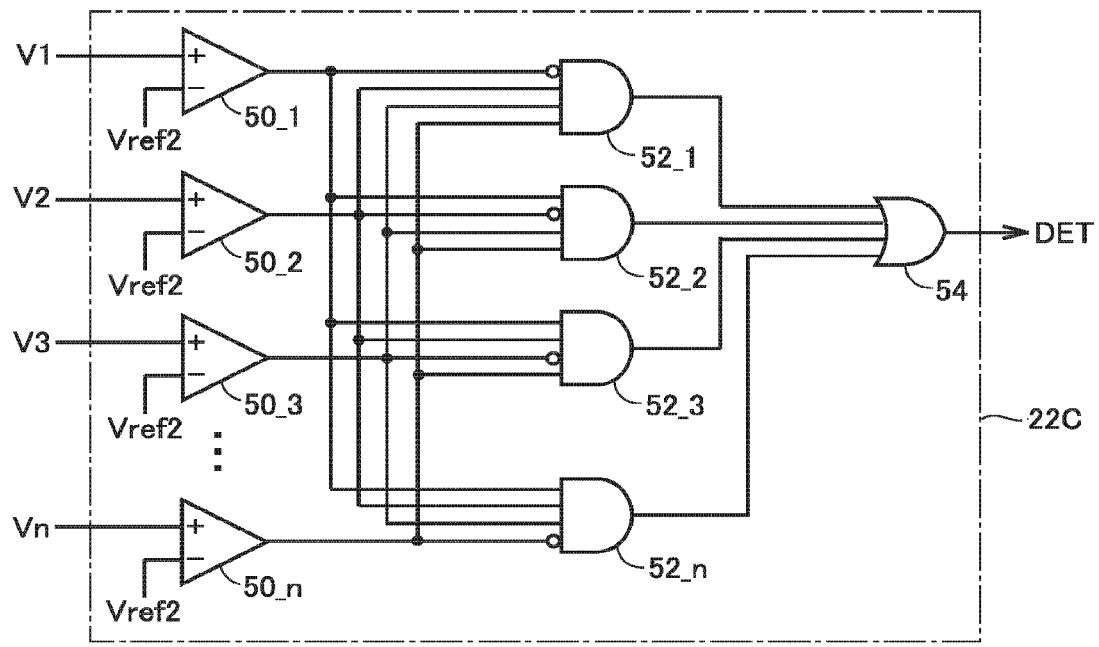
FIG. 7 is a block diagram for illustrating a third configuration example of the determination unit configured to execute the cutoff abnormality determination processing shown in step S05 of FIG. 4.

FIG. 7 is a block diagram for illustrating the third configuration example of the determination unit configured to execute the cutoff abnormality determination processing shown in step S05 of FIG. 4. The function of each block shown in FIG. 7 can be implemented by software processing and/or hardware processing executed by control device 20.

Referring to FIG. 7, a determination unit 22C has n comparators 50_1 to 50_$n$, n AND circuits 52_1 to 52_$n$, and an OR circuit 54.

n comparators 50_1 to 50_$n$ respectively receive terminal-to-terminal voltages V1 to Vn of the semiconductor switching elements detected by n voltage detectors 18. When comparators 50_1 to 50_$n$ are collectively described, they will also be simply referred to as "comparators 50". Each comparator 50 compares terminal-to-terminal voltage V of corresponding semiconductor switching element SW with reference value Vref2, and outputs a signal indicating the result of comparison. When terminal-to-terminal voltage V is larger than reference value Vref2, the output signal of comparator 50 is set to an H level, and when terminal-to-terminal voltage V is smaller than reference value Vref2, the output signal of comparator 50 is set to an L level.

Each of n AND circuits 52_1 to 52_$n$ calculates a logical multiplication of the output signals of n comparators 50_1 to 50_$n$, and outputs a signal indicating the result of calculation. When AND circuits 52_1 to 52_$n$ are collectively described, they will also be simply referred to as "AND circuits 52". One of the output signals of n comparators 50 is inverted and input to each AND circuit 52. The output signal of which comparator 50 should be inverted is different for each of n AND circuits 52.

OR circuit 54 calculates a logical sum (OR) of the output signals of AND circuits 52_1 to 52_*n*, and outputs a signal indicating the result of calculation. The output signal of OR circuit 54 is output to the outside of power supply device 10 (for example, to the higher order controller), as detection signal DET.

For example, it is assumed that, in a state where cutoff commands are provided to n semiconductor switching elements SW1 to SWn, any one semiconductor switching element SW cannot be cut off, and remaining (n−1) semiconductor switching elements SW are normally turned off.

When any one semiconductor switching element SW is semiconductor switching element SW1, a signal at an L level is output from comparator 50_1, and signals at an H level are output from comparators 50_2 to 50_*n*. Thereby, AND circuit 52_1 receives an inverted signal of the output signal of comparator 50_1 and the output signals of comparators 50_2 to 50_*n*, and outputs a signal at an H level. On the other hand, each of AND circuits 52_2 to 52_*n* receives the output signal of comparator 50_1 and the output signals of comparators 50_2 to 50_*n* (any one of which is an inverted signal), and outputs a signal at an L level. As a result, detection signal DET at an H level is output from OR circuit 54.

That is, in determination unit 22C, when terminal-to-terminal voltage V of any one semiconductor switching element SW of n semiconductor switching elements SW1 to SWn is smaller than reference value Vref2, detection signal DET at the H level is output.

It should be noted that, according to the cutoff abnormality determination processing executed by determination unit 22C, when two or more semiconductor switching elements SW cannot be cut off, the output signals of n AND circuits 52 are all set to the L level, and thus it is not possible to sense a cutoff abnormality. Therefore, the cutoff abnormality determination processing executed by determination unit 22C is preferably applied to power supply device 10 in which it is unlikely that the plurality of semiconductor switching elements SW cannot be cut off at the same time.

In addition, as in determination units 22A and 22B, according to the cutoff abnormality determination processing executed by determination unit 22C, when the voltage difference between input voltage Vin and output voltage Vout is small, there is no significant difference between terminal-to-terminal voltage V of semiconductor switching element SW which cannot be cut off and terminal-to-terminal voltage V of semiconductor switching element SW which is normally turned off, and thus it is difficult to sense a cutoff abnormality. However, under such circumstances, there occurs no situation where an overvoltage is applied to semiconductor switching element SW in the OFF state. Thus, it is considered that no defect would be caused by not being able to sense a cutoff abnormality.

According to the conventional technique of sensing a cutoff abnormality for each semiconductor switching element based on a terminal-to-terminal voltage thereof, when semiconductor switching element SW which is normally turned off has small terminal-to-terminal voltage V, semiconductor switching element SW may be erroneously sensed as not being able to be cut off. In contrast, determination unit 22C is configured to sense a cutoff abnormality based on terminal-to-terminal voltages V1 to Vn of n semiconductor switching elements SW1 to SWn, and thus can avoid such erroneous sensing.

As described above, according to power supply device 10 in accordance with the third embodiment, a cutoff abnormality of a semiconductor switching element constituting the switch circuit can be accurately sensed.

Here, a result of comparison among manners of cutoff abnormalities which can sensed by determination units 22A to 22C in the first to third control configuration examples described above will be provided. FIG. 8 shows manners of cutoff abnormalities which can be sensed by each of determination units 22A to 22C when the total number n of semiconductor switching elements SW is four, in the form of a table.

V1 to V4 in the table indicate the terminal-to-terminal voltages of semiconductor switching elements SW1 to SW4. Values (H or L) of V1 to V4 indicate the levels of the output signals of the comparators to which V1 to V4 are input.

For example, in determination unit 22A, when terminal-to-terminal voltage V1 of semiconductor switching element SW1 is smaller than reference value Vref1 (V1<Vref1), that is, when semiconductor switching element SW1 cannot be cut off, the output signal of corresponding comparator 34_1 is set to the H level. On the other hand, when terminal-to-terminal voltage V1 of semiconductor switching element SW1 is larger than reference value Vref1 (V1>Vref1), that is, when semiconductor switching element SW1 is normally turned off, the output signal of comparator 34_1 is set to the L level.

In determination unit 22B (or 22C), when terminal-to-terminal voltage V1 of semiconductor switching element SW1 is smaller than reference value Vref2 (V1<Vref2), that is, when semiconductor switching element SW1 cannot be cut off, the output signal of corresponding comparator 40_1 (or 50_1) is set to the L level. On the other hand, when terminal-to-terminal voltage V1 of semiconductor switching element SW1 is larger than reference value Vref2 (V1>Vref2), that is, when semiconductor switching element SW1 is normally turned off, the output signal of comparator 40_1 (or 50_1) is set to the H level.

FIG. 8 shows whether or not determination units 22A to 22C can sense a cutoff abnormality, for each of: a case where any one of four semiconductor switching elements SW1 to SW4 cannot be cut off (the number of abnormal elements=1); a case where two or more semiconductor switching elements SW cannot be cut off and one or more semiconductor switching elements are normal (the number of abnormal elements≥2 and the number of normal elements≥1); and a case where all of four semiconductor switching elements SW cannot be cut off (all elements are abnormal). "OK" indicates that the determination unit can sense a cutoff abnormality, and "NG" indicates that the determination unit cannot sense a cutoff abnormality.

As shown in FIG. 8, determination unit 22A can sense a cutoff abnormality in all of the case where the number of abnormal elements=1, the case where the number of abnormal elements≥2 and the number of normal elements≥1, and the case where all elements are abnormal.

In contrast, determination unit 22B can sense a cutoff abnormality in the case where the number of abnormal elements=1 and the case where the number of abnormal elements≥2 and the number of normal elements≥1, whereas determination unit 22B cannot sense a cutoff abnormality in the case where all elements are abnormal.

In addition, determination unit 22C can sense a cutoff abnormality in the case where the number of abnormal elements=1, whereas determination unit 22C cannot sense a cutoff abnormality in the case where the number of abnormal elements≥2 and the number of normal elements≥1 and the case where all elements are abnormal.

Thus, the manners of cutoff abnormalities which can be sensed by determination units 22A to 22C are different. Therefore, one of determination units 22A to 22C can be selected depending on what manner is desired to be sensed. Alternatively, any one of determination units 22A to 22C may be selected according to the total number n of semiconductor switching elements SW constituting switch circuit 11. For example, when n is a relatively large value and it is considered unlikely that a defect that all elements are abnormal occurs, determination unit 22B or 22C can be applied. Further, when it is considered unlikely that two or more semiconductor switching elements SW cannot be cut off at the same time, determination unit 22C can be applied. On the other hand, when a defect that all elements are abnormal may occur irrespective of whether n is large or small, determination unit 22A can be applied.

FIG. 9 is a block diagram for illustrating a fourth configuration example of the determination unit configured to execute the cutoff abnormality determination processing shown in step S05 of FIG. 4. Referring to FIG. 9, a determination unit 22 has determination units 22A to 22C, and a selection unit 24 for selecting any one of these determination units. Selection unit 24 is provided with a selection signal for selecting a determination unit to be used for the cutoff abnormality determination processing, from the higher order controller. Selection unit 24 is configured to output the detection signals of voltage detectors 14, 16, and 18 to the determination unit selected by the selection signal.

Fourth Embodiment

According to the cutoff abnormality determination processing executed by determination units 22A to 22C in the first to third control configuration examples described above, when the voltage difference between input voltage Vin and output voltage Vout is small, there is no significant difference between terminal-to-terminal voltage V of semiconductor switching element SW which cannot be cut off and terminal-to-terminal voltage V of semiconductor switching element SW which is normally turned off, and thus it is difficult to sense a cutoff abnormality.

Accordingly, when the voltage difference between input voltage Vin and output voltage Vout is small, sensing of a cutoff abnormality may not be executed, as shown in FIG. 10.

FIG. 10 is a flowchart illustrating control processing for power supply device 10 in accordance with a fourth embodiment. The flowchart of FIG. 10 is implemented by adding processing in step S07 to the flowchart of FIG. 4.

Referring to FIG. 10, during operation of bidirectional converter 12, in step S04, control device 20 produces cutoff commands for semiconductor switching elements SW1 to SWn of switch circuit 11.

During production of the cutoff commands, in step S07, control device 20 determines whether or not the voltage difference between input voltage Vin and output voltage Vout (|Vin−Vout|) is larger than a threshold value Vth2. In a case where |Vin−Vout|>Vth2 (when it is determined YES in S07), control device 20 proceeds to step S05 to execute the cutoff abnormality determination processing for determining whether or not a cutoff abnormality of switch circuit 11 has occurred. On the other hand, in a case where |Vin−Vout|≤Vth2 (when it is determined NO in S07), control device 20 does not execute the cutoff abnormality determination processing.

Power supply device 10 in accordance with the fourth embodiment can eliminate a possibility that, when the voltage difference (|Vin−Vout|) is small, semiconductor switching element SW which is normally turned off has small terminal-to-terminal voltage V, and thus semiconductor switching element SW may be erroneously determined as not being able to be cut off. In particular, since determination units 22B and 22C are configured to determine a cutoff abnormality using only terminal-to-terminal voltages V of semiconductor switching elements SW, erroneous sensing of a cutoff abnormality can be prevented by applying the control processing in the fourth embodiment.

It should be noted that, under a circumstance where the voltage difference (|Vin−Vout|) is small, there occurs no situation where an overvoltage is applied to semiconductor switching element SW in the OFF state. Thus, it is considered that no defect would be caused by not being able to sense a cutoff abnormality.

It should be noted that it has been intended from the time of filing of the present application to appropriately combine the configurations described in a plurality of embodiments described above, including any combination which is not mentioned in the specification, within a range free of inconsistency or contradiction.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: AC power supply; 2: load; 3: battery (power storage device); 10: power supply device; 11: switch circuit; 12: bidirectional converter (power converter); 14, 16, 18: voltage detector; 20: control device; 22, 22A, 22B, 22C: determination unit; 24: selection unit; 30: subtractor; 32, 34_1 to 34_n, 40_1 to 40_n, 50_1 to 50_n: comparators; 38, 44, 46, 52_1 to 52_n: AND circuits; 36, 42, 54: OR circuit; DET: detection signal; N1: input node; N2: output node; SW1 to SWn: semiconductor switching elements (switching elements).

The invention claimed is:

1. A power supply device for supplying power to a load, the power supply device comprising:
- a switch circuit having an input node connected to an AC power supply and an output node connected to the load;
- a power converter configured to execute bidirectional power conversion between AC power output to the output node and DC power input/output to a power storage device; and
- a control device configured to control the switch circuit and the power converter,
- the switch circuit including n switching elements (n being an integer more than or equal to 2) connected in series between the input node and the output node,
- the control device being configured to convert the DC power in the power storage device into AC power synchronized with AC power supplied from the AC power supply during a normal state and supply the AC power to the output node, by controlling the power converter, when an abnormality of at least one of the AC power supply and the switch circuit is sensed in a state where the control device outputs conduction commands for conducting the n switching elements, the control device being further configured to produce cutoff commands for cutting off the n switching elements during execution of the power conversion in the power converter, and sense a cutoff abnormality of the switch circuit when a voltage difference between the input node and the output node is larger than a first threshold value, and the terminal-to-terminal voltages of p switching elements (1≤p≤n) of the n switching elements are smaller than a reference value.

2. The power supply device according to claim 1, wherein the control device is configured not to execute sensing of the cutoff abnormality of the switch circuit, when a voltage difference between the input node and the output node is smaller than a second threshold value, during the production of the cutoff commands.

3. A power supply device for supplying power to a load, the power supply device comprising:

a switch circuit having an input node connected to an AC power supply and an output node connected to the load;

a power converter configured to execute bidirectional power conversion between AC power output to the output node and DC power input/output to a power storage device; and a control device configured to control the switch circuit and the power converter, the switch circuit including n switching elements (n being an integer more than or equal to 2) connected in series between the input node and the output node, the control device being configured to convert the DC power in the power storage device into AC power synchronized with AC power supplied from the AC power supply during a normal state and supply the AC power to the output node, by controlling the power converter, when an abnormality of at least one of the AC power supply and the switch circuit is sensed in a state where the control device outputs conduction commands for conducting the n switching elements, the control device being further configured to produce cutoff commands for cutting off the n switching elements during execution of the power conversion in the power converter, and selectively execute any one of:

(a) processing for sensing the cutoff abnormality of the switch circuit, when a voltage difference between the input node and the output node is more than a first threshold value, and the terminal-to-terminal voltages of m switching elements (1≤m≤n) of the n switching elements are smaller than a reference value;

(b) processing for sensing the cutoff abnormality of the switch circuit, when the terminal-to-terminal voltages of q switching elements (1≤q≤(n−1)) of the n switching elements are smaller than a reference value; and (c) processing for sensing the cutoff abnormality of the switch circuit, when the terminal-to-terminal voltage of any one switching element of the n switching elements is smaller than a reference value.

4. The power supply device according to claim 3, wherein the control device is configured not to execute sensing of the cutoff abnormality of the switch circuit, when a voltage difference between the input node and the output node is smaller than a second threshold value, during the production of the cutoff commands.

* * * * *